United States Patent [19]

Doshi

[11] Patent Number: 4,713,145
[45] Date of Patent: Dec. 15, 1987

[54] METHOD OF ETCHING ETCH-RESISTANT MATERIALS

[75] Inventor: Vikram N. Doshi, Costa Mesa, Calif.

[73] Assignee: Gulton Industries, Inc., Costa Mesa, Calif.

[21] Appl. No.: 943,683

[22] Filed: Dec. 19, 1986

[51] Int. Cl.$^4$ .......................... B44C 1/22; C23F 1/00
[52] U.S. Cl. .................................. 156/667; 156/663; 252/79.2
[58] Field of Search ............... 156/639, 647, 662, 663, 156/667, 903; 252/79.2; 65/31

[56] References Cited

U.S. PATENT DOCUMENTS

| | | | |
|---|---|---|---|
| 3,971,683 | 7/1976 | Briska et al. | 252/79.2 X |
| 4,381,216 | 4/1983 | Singh | 252/79.2 X |
| 4,610,759 | 9/1986 | Klages | 156/667 X |
| 4,647,477 | 3/1987 | DeLuca | 156/667 X |

Primary Examiner—William A. Powell
Attorney, Agent, or Firm—Blakely, Sokoloff, Taylor & Zafman

[57] ABSTRACT

A method for etching sapphire and other etch-resistant materials is disclosed. The method consists of preparing a hot, precipitated-gel form of phosphoric acid solution and immersing the item to be etched in the hot, precipitated-gel. The gel is prepared by heating a liquid phosphoric acid solution, causing water contained in the solution to evaporate. As the water evaporates, the solution thickens and eventually attains the precipitated-gel state. The etching rate of a sapphire wafer immersed in the gel is on the order of 10-50 microns per hour, depending on the depth of immersion, the orientation of the wafer and the temperature of the gel.

8 Claims, 3 Drawing Figures

| STEP NO | ELAPSED TIME (H:M) | PROCEDURE | ACID VOL (ml) | ACID TEMP (°C) | ACID CONDITION | WAFER THICKNESS T (μ) A | WAFER THICKNESS T (μ) B | ΔT (T₀-T) (μ) A | ΔT (T₀-T) (μ) B | ETCH RATE (μ/HR) A | ETCH RATE (μ/HR) B |
|---|---|---|---|---|---|---|---|---|---|---|---|
| 1 | 0:00 | POUR ACID IN BEAKER. TURN HEATING PLATE ON | 130 | ROOM TEMP | 85% CLEAR LIQUID | | | | | | |
| 2 | 0:15 | PLACE 2 SAPPHIRE WAFERS IN BEAKER. | 130 | 50-60 | CLEAR LIQUID, BUBBLING STARTS AT WAFERS | 320 | 318 | 0 | 0 | | |
| 3 | 0:30 | | 125 | 125-150 | VIGOROUS BUBBLING. | | | | | 10 | 9 |
| 4 | 0:45 | | 110 | 125-150 | BUBBLING BEGINS TO SLOW. | | | | | | |
| 5 | 1:00 | | 105 | 125-150 | SLOWER BUBBLING. | | | | | | |
| 6 | 1:05 | | 105 | 125-150 | VERY SLOW BUBBLING. | | | | | | |
| 7 | 1:15 | TURN HEATING PLATE OFF. REMOVE & MEASURE WAFERS | 100 | 125-150 | THICK LIQUID | 310 | 309 | 10 | 9 | | |
| 8 | 1:25 | TURN HEATING PLATE ON. REPLACE WAFERS. | 100 | 125-150 | VERY VERY SLOW BUBBLING | | | | | 37 | 41 |
| 9 | 1:45 | | 100 | 125-150 | BUBBLING ENDS, WHITE PRECIPITATE APPEARS | | | | | | |
| 10 | 2:00 | | 100 | 125-150 | DENSE GEL WITH WHITE PRECIPITATE | | | | | | |
| 11 | 2:10 | | 100 | 125-150 | DENSE GEL WITH WHITE PRECIPITATE | | | | | | |
| 12 | 2:15 | TURN HEATING PLATE OFF. | 90 | 125-150 | DENSE GEL WITH WHITE PRECIPITATE | 270 | 265 | 50 | 53 | | |
| 13 | 2:20 | REMOVE & MEASURE WAFERS | 90 | 125-150 | DENSE GEL WITH WHITE PRECIPITATE | | | | | 40 | 28 |
| 14 | 2:30 | REPLACE WAFERS. TURN HEATING PLATE ON. | 90 | 125-150 | DENSE GEL WITH WHITE PRECIPITATE | | | | | | |
| 15 | 2:45 | TURN HEATING PLATE OFF. REMOVE & MEASURE WAFERS | 90 | 127 | DENSE GEL WITH WHITE PRECIPITATE | 260 | 258 | 60 | 60 | | |

Fig. 2

METHOD OF ETCHING ETCH-RESISTANT MATERIALS

BACKGROUND OF INVENTION

1. Field of the Invention

The present invention relates to the field of crystalline materials processing and, more particularly, to the removal of material from the surfaces of crystalline structures by etching.

2. Art Background

Of crucial importance to the semiconductor industry is the ability to produce very precise and very minute electronic circuits on the surfaces of semiconductor materials, most commonly crystalline silicon. In order to produce high quality semiconductors, the surface of such crystalline materials must be properly prepared.

Etching is a method of processing crystalline materials in which acids are used to dissolve away desired portions of a crystalline surface. A mask is placed over the surface of the crystal, leaving exposed the areas from which material is to be removed, and the crystal is immersed in an etchant. Commonly used etchants include potassium Hydronide (KOH), Hydrofloric Acid (HF), NaOH (for Silicon) and sulfuric acid ($H_2SO_4$). By controlling the time that the crystal is immersed in the etchant very precise amounts of material can be removed. Unfortunately, however, some important materials used in semiconductor manufacturing, such as sapphire, are inherently resistant to etching.

Sapphire, a crystalline form of $Al_2O_3$ having a density of 3.98, a melting point of 2040° C. and a Mohs hardness of 9.0, is becoming increasingly important as a substrate for thin film components and integrated circuits because of its inherent radiation resistance, smooth surface finish and high dielectric constant (480 KV/cm). Silicon on Sapphire (SOS) semiconductors, originally developed for critical military applications, are being increasingly used wherever high speed, low power dissipation and high radiation resistance are desired.

Despite having many desirable properties, the use of sapphire in semiconductors is limited by its resistance to conventional etchants. As shown in Table 1, on page 435 of *Thin Film Processes* by Vossen & Kern (Academic Press 1978), conventional etchants, including phosphoric acid, are ineffective for etching sapphire.

The present invention, however, discloses a method with which phosphoric acid, previously thought to be ineffective for etching sapphire, can be used to successfully etch sapphire. The method may also be adapted to etch other materials that have previously shown a high resistance to conventional etchants.

SUMMARY OF THE INVENTION

Phosphoric acid is a water-soluble acid that exists as a clear, colorless, odorless liquid or a transparent crystalline solid depending on concentration and temperature. At room temperature, 50% and 75% solutions (by volume) of phosphoric acid are liquids, the 100% acid is in the form of crystals, and the 85% solution is of a syrupy consistency.

The invention consists of a method of treating phosphoric acid so as to produce a highly effective etchant, and a method of using the etchant produced to etch sapphire and other etch resistant materials.

A quantity of 85% phosphoric acid solution is placed in a container, such as a beaker, and heated to a temperature of around 125° C. to 150° C. It is maintained at that temperature until about 30% of the original volume of the acid has evaporated. As the liquid evaporates, the form of the acid changes slowly from a syrupy liquid into a much thicker gel-like substance. The gel-like form appears to be an intermediate form between the liquid and solid phases of the acid. As the acid solution begins to gel, a white precipitate also appears. If a sample of sapphire is placed in this hot gel and precipitant mixture, the upper-most surface of the sample exhibits an etch rate of between 20 and 60 microns per hour.

BRIEF DESCRIPTION OF THE DRAWINGS

FIG. 2 is an illustration of a table listing the procedures used, and the results obtained, in the first experiment.

DETAILED DESCRIPTION OF THE INVENTION

A method for etching sapphire and other etch-resistant materials is disclosed. In the following description, for purposes of explanation, numerous details are set forth, such as specific concentrations, volumes, temperatures and processing times in order to provide a thorough understanding of the present invention. However, it will be apparent to one skilled in the art that the invention may be practiced without these specific details. In other instances, well-known pieces of laboratory apparatus, such as beakers and hot plates, have not been described in detail in order not to obscure the present invention unnecessarily.

The invention is based on a series of experiments dealing with the etching of sapphire wafers by phosphoric acid.

Figure 1:
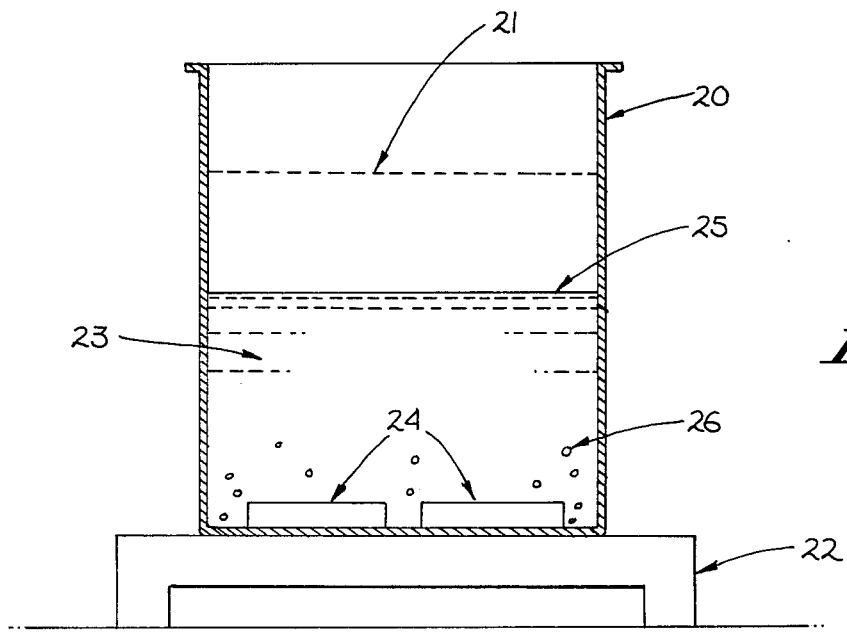
FIG. 1 is an illustration of the apparatus used in the first experiment.

The first experiment is illustrated in FIG. 1 and described in FIG. 2. Referring to FIGS. 1 and 2, a glass beaker 20 was filled with 130 milliliters of 85% (by volume) phosphoric acid solution 23 and placed on a heating plate 22 (Step 1). The original level of acid in the beaker is generally indicated by number 21 in FIG. 1. After fifteen minutes, when the temperature of the solution had reached 50° C. to 60° C., two sapphire wafers 24 were placed horizontally in the bottom of the beaker (Step 2). After the sapphire wafers were placed in the beaker, the acid started bubbling vigorously, the bubbles appearing to emanate from the surface of the sapphire wafers. After 30 minutes, the volume of the acid had decreased by 5 milliliters to 125 milliliters. The acid was still clear and bubbling vigorously (Step 3). Over the next half hour, the volume of acid decreased from 125 to 105 milliliters, and the bubbling slowed down (Steps 4 and 5). Over the next fifteen minutes, the bubbling continued to slow down and the volume of the acid decreased to 100 milliliters. After an hour and fifteen minutes, the heating plate was turned off and the sapphire wafers were removed and measured. At this point, the wafers had been submerged in the acid for approximately one hour. It was found that the thickness of the two wafers had decreased by ten microns and 9 microns, respectively. The average etch rate for the first hour was, therefore, about 10 microns per hour (Step 7). At one hour and twenty-five minutes into the experiment, the heating plate was turned back on, and the wafers replaced (Step 8). The acid at this point was a very thick liquid. Over the next half hour, the bubbling was very slow and the volume of the acid remained at 100 milliliters (Steps 9 and 10). The bubbling finally stopped at two hours and ten minutes into the experiment, and a white precipitate 26 began to form. The volume of the acid was still one hundred milliliters and its consistency was that of a thick, dense gel. At the two hours and fifteen minute point (Step 12), the volume of the acid had decreased to 90 milliliters and the heating plate was turned off. The level of acid in the beaker at this point is indicated by number 25 in FIG. 1. Five minutes later (Step 13), the sapphire wafers were removed and measured. It was found that the thickness of the wafers had decreased 50 microns and 53 microns, respectively, from the original thickness of the wafers. During the second hour of immersion in the acid, therefore, the wafers were etched at average rates of 37 and 41 microns per hour. The wafers were placed in the beaker (Step 14), and the heating plate was turned back on. The acid continued to be a dense gel with a white precipitate. After another fifteen minutes, the heating plate was turned off and the wafers once again removed (Step 15). The temperature of the acid and the thickness of the wafers were measured. The acid temperature was found to be 127° C., while the thickness of the wafers had decreased 60 microns from the original thickness of the wafers. During the last fifteen minutes of the experiment, the acid exhibited average etch rates of 40 and 28 microns per hour.

Figure 3:
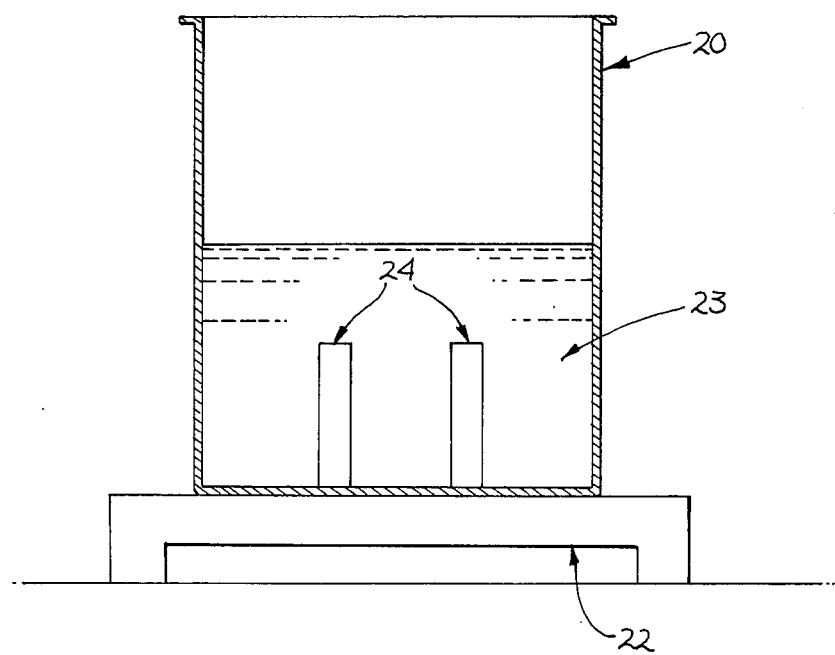
FIG. 3 is an illustration of the apparatus used in a subsequent experiment, showing the wafer oriented in a vertical direction.

It appeared that significant etching took place only when the acid was in the heated, precipitated-gel form. Additional experiments were therefore performed, in which the sapphire wafers were not placed in the acid until the precipitated-gel form was obtained. In one experiment, the phosphoric acid failed to attain the precipitated-gel form. In other experiments, the acid did attain its precipitated-gel form and sapphire wafers were placed in the precipitated-gel form at various orientations for etching. It was found that wafers placed horizontally in the acid exhibited etch rates of 20 to 60 microns per hour, while wafers placed vertically in the acid (See FIG. 3) exhibited only a very slow etch rate that varied from a minimum at the top end of the wafer to a maximum of about 10 microns per hour at the bottom. This experiment seemed to indicate that the etch rate depended on the orientation of the wafer surface as well as the depth of the acid.

Accordingly, a method of preparing a precipitated-gel form of phosphoric acid and using that form of the acid to etch previously etch-resistant materials, particularly sapphire, has been disclosed. The invention provides a simple and economical means for etching sapphire and other materials that was not possible in the prior art. Although specific steps and details are described herein, it will be understood that various changes can be made in the details, arrangements and proportions of the various elements of the present invention without departing from the scope and spirit of the invention. For example, it will be apparent that in addition to using an 85% phosphoric acid solution to prepare the precipitated-gel form of the acid, other concentrations of the acid may be used as well. The temperature to which the phosphoric acid solution is heated may also be varied, as may the kind of material that is etched, the length of time that the item to be etched is immersed in the acid, and the temperature of the acid during etching.

Other variations will be apparent to those skilled in the art.

What is claimed for the invention is as follows:

1. A method for etching the surface of an item, comprising the steps of:
   placing a quantity of phosphoric acid solution in a vessel;
   heating the vessel for a period of time until the liquid phosphoric acid solution jells and a white precipitate forms, resulting in a gel-like precipitated form of phosphoric acid;
   submerging the item in the gel-like precipitated form of phosphoric acid;
   maintaining the gel-like precipitated form of phosphoric acid at an elevated temperature; and
   removing the item from the gel-like precipitated form of the phosphoric acid after a period of time, the length of which period of time depends on the amount of etching that is desired.

2. The method as defined by claim 1, in which the gel-like precipitated form of phosphoric acid is produced by heating a volume of 85% (by volume) phosphoric acid solution until approximately 30% of the original volume of the phosphoric acid solution has been evaporated.

3. The method as defined by claim 1, in which the item to be etched is comprised of single-crystalline sapphire.

4. The method as defined by claim 1, in which the gel-like precipitated form of phosphoric acid is produced by continuous heating of the liquid phosphoric acid solution.

5. The method as defined by claim 1, in which the gel-like precipitated form of phosphoric acid is produced by intermittent heating of the liquid phosphoric acid solution.

6. The method as defined by claim 1, in which the amount of etching produced per period of time depends on the temperature of the gel-like precipitated form of phosphoric acid.

7. The method as defined by claim 1, in which the amount of etching produced per period of time depends on the orientation of the item when it is submerged in the gel-like precipitated form of phosphoric acid.

8. The method as defined by claim 1, in which the amount of etching produced per period of time depends on the depth at which the items are submerged in the gel-like precipitated form of the acid.

* * * * *